United States Patent [19]
Swanson et al.

[11] Patent Number: 5,155,409
[45] Date of Patent: Oct. 13, 1992

[54] INTEGRAL CONDUCTOR FOR A PIEZOELECTRIC ACTUATOR

[75] Inventors: Morris A. Swanson, Washington, Ill.; Manfred Greuel, Cologne, Fed. Rep. of Germany

[73] Assignee: Caterpillar Inc., Peoria, Ill.

[21] Appl. No.: 728,395

[22] Filed: Jul. 11, 1991

[51] Int. Cl.$^5$ .............................. H01L 41/08
[52] U.S. Cl. ..................... 310/366; 310/328; 310/365
[58] Field of Search ............ 310/328, 365, 366

[56] References Cited

U.S. PATENT DOCUMENTS

| | | | |
|---|---|---|---|
| 2,479,926 | 8/1949 | Gravley | 310/366 |
| 3,501,099 | 3/1970 | Benson | 239/535 |
| 3,635,016 | 1/1972 | Benson | 60/23 |
| 4,460,842 | 7/1984 | Waanders et al. | 310/338 |
| 4,499,566 | 2/1985 | Abbott | 367/165 |
| 4,701,659 | 10/1987 | Fujii et al. | 310/366 |
| 4,752,712 | 6/1988 | Tomita et al. | 310/328 |
| 5,055,734 | 10/1991 | Grawey et al. | 310/366 |

FOREIGN PATENT DOCUMENTS

| | | | |
|---|---|---|---|
| 0121784 | 6/1985 | Japan | 310/366 |
| 58210707 | 6/1985 | Japan | |
| 0088875 | 4/1988 | Japan | 310/366 |

Primary Examiner—Mark O. Budd
Assistant Examiner—Thomas M. Dougherty
Attorney, Agent, or Firm—David M. Masterson

[57] ABSTRACT

A piezoelectric actuator is provided. The actuator includes a plurality of piezoelectric discs having first and second faces. The discs are axially aligned and arranged such that the first face of one disc is adjacent to the first face of a preceding disc in the actuator, and the second face of the one disc is adjacent to the second face of a succeeding disc. Also included is a first single-piece conductor having multiple electrodes, a first reference line passing through the center of each electrode and longitudinally through the first conductor, and a plurality of connecting portions adapted to interconnect each electrode. The connecting portions are offset from the first reference line, and the first conductor is folded at the connecting portions and interposed between the piezoelectric discs such that successive electrodes interleave and contact the first faces of the discs. The actuator further includes a second single-piece conductor having multiple electrodes. The second conductor is folded and interposed between the piezoelectric discs such that successive electrodes interleave and contact the second faces of each of the discs throughout the actuator.

15 Claims, 6 Drawing Sheets

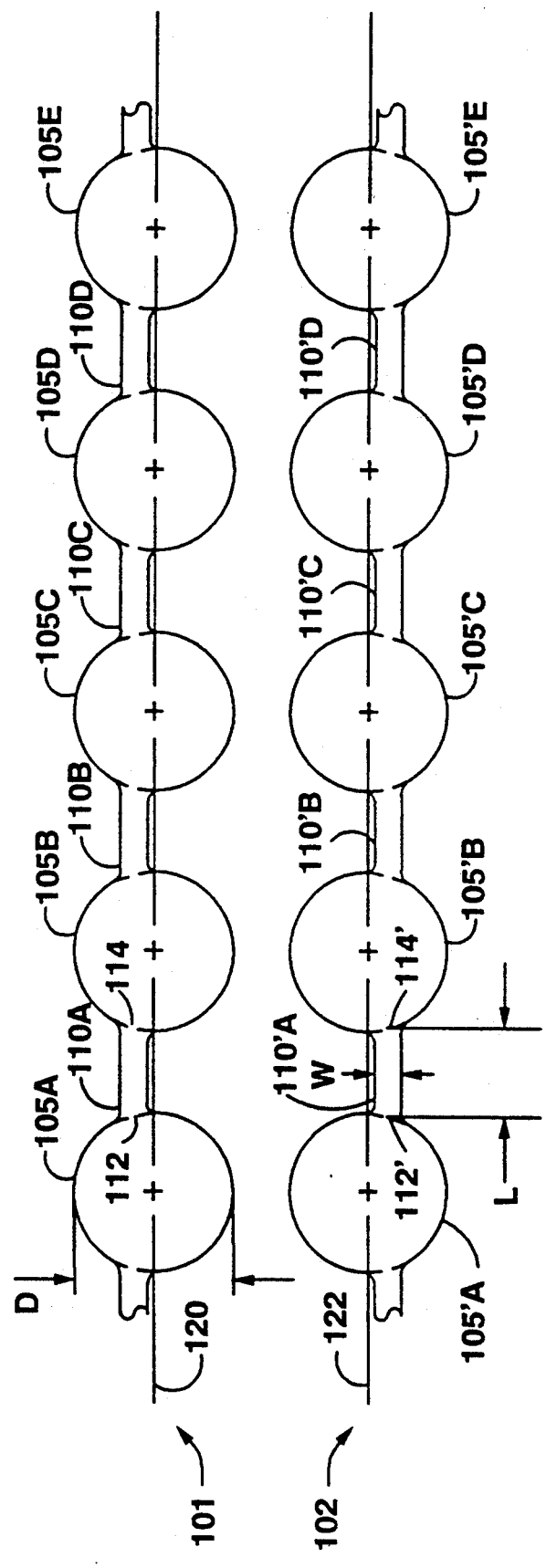
Fig_1A

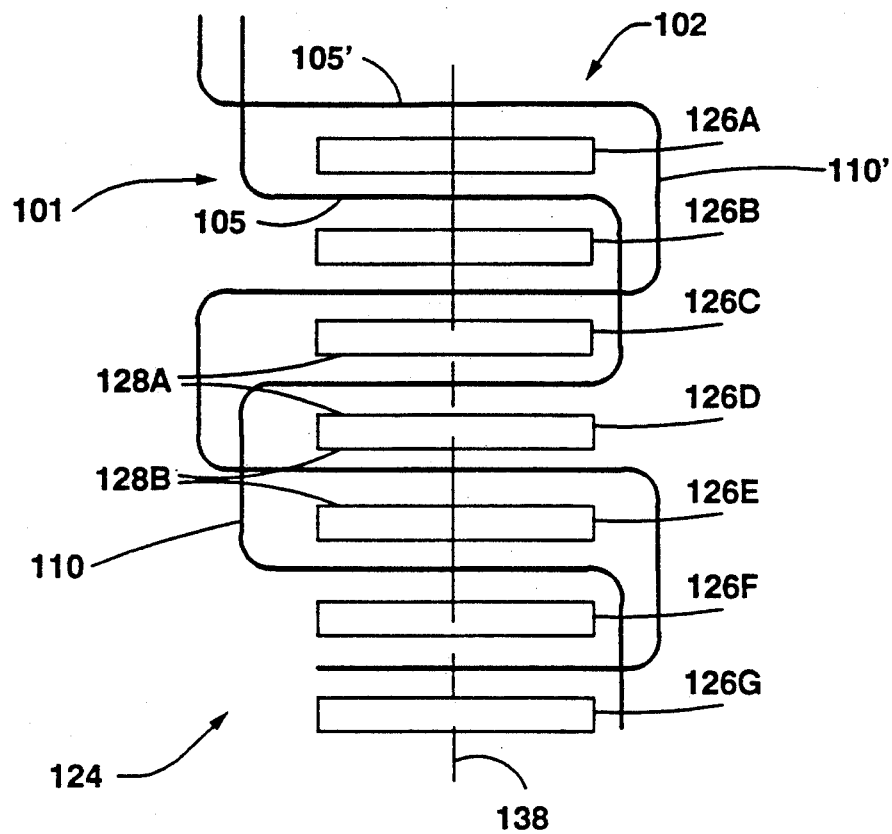
Fig_1B_
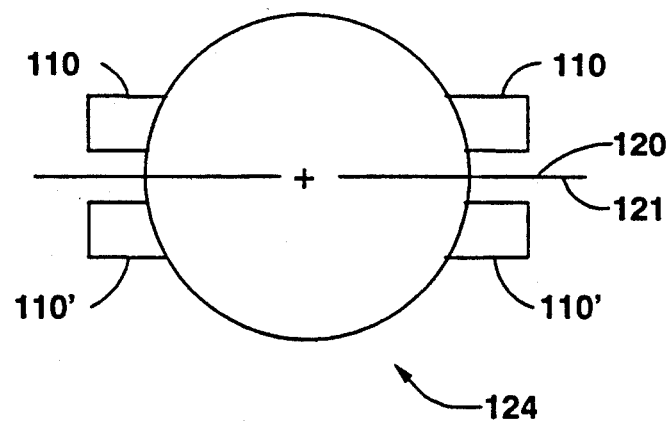
Fig_1C_

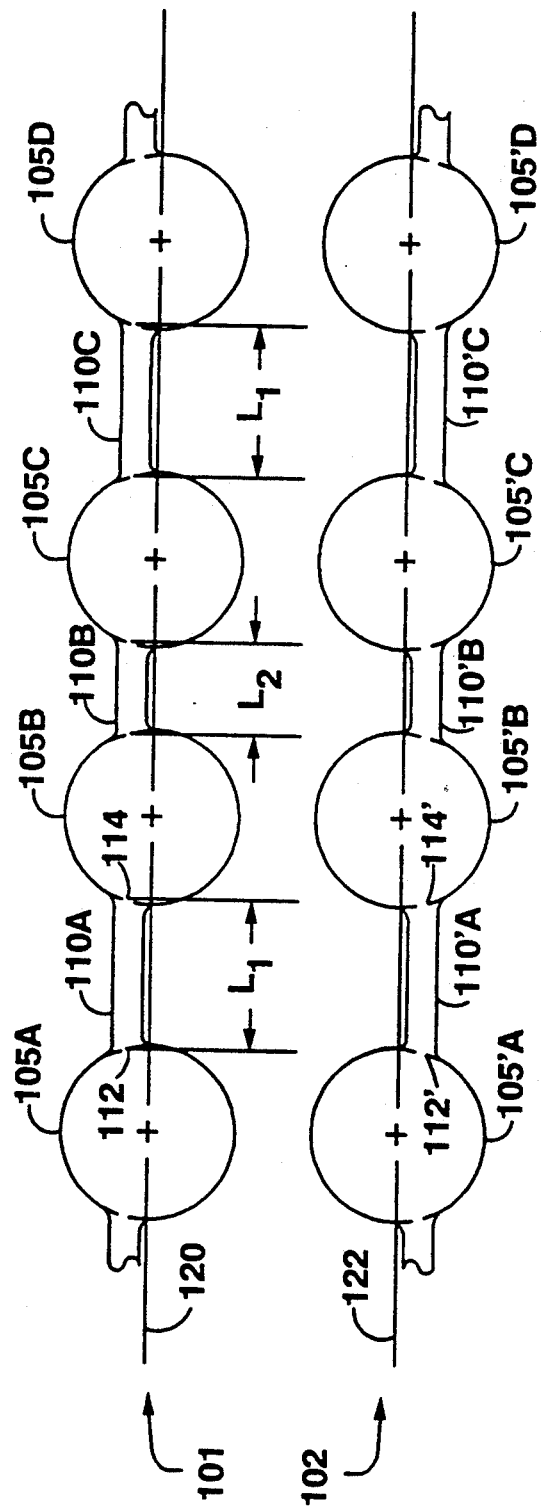

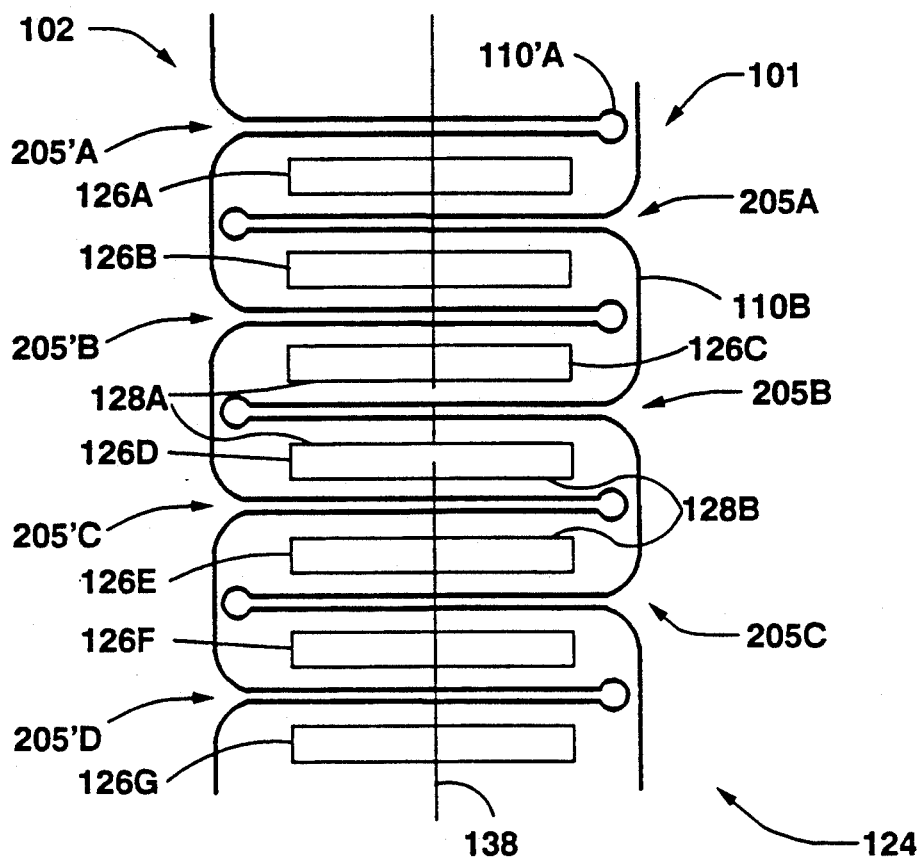
Fig_2B_
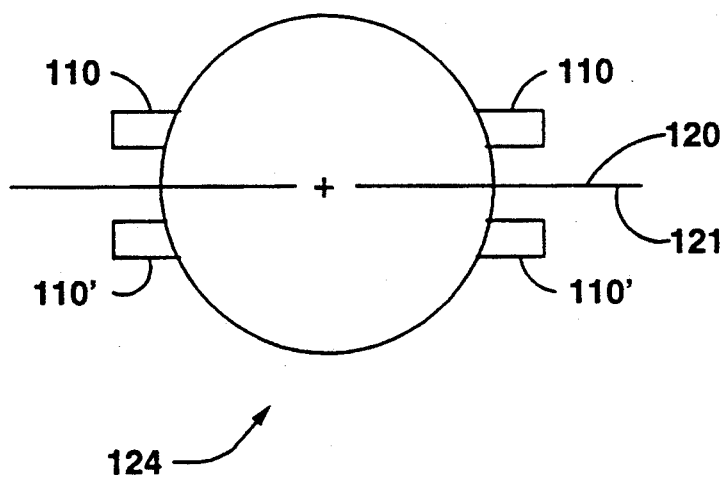
Fig_2C_

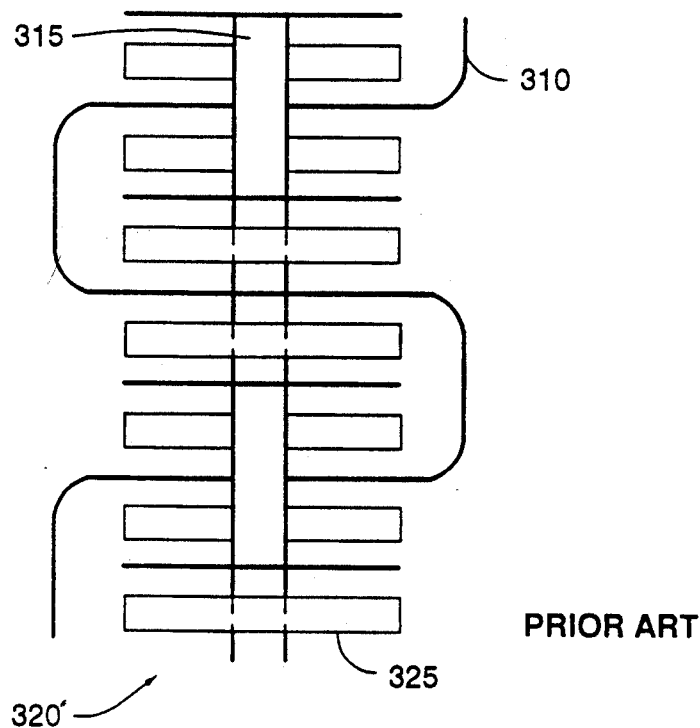
PRIOR ART
Fig_3B_
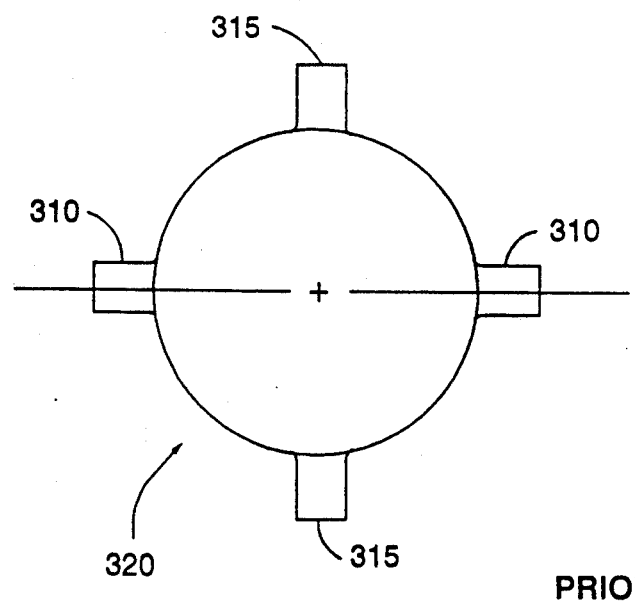
PRIOR ART
Fig_3C_

5,155,409

INTEGRAL CONDUCTOR FOR A PIEZOELECTRIC ACTUATOR

DESCRIPTION

1. Technical Field

This invention relates generally to a conductor for an actuator and, more particularly, to a single-piece conductor for an actuator incorporating piezoelectric elements.

2. Background Art

Commercially manufactured piezoelectric actuators are produced using a stack of piezoelectric discs interleaved with metal foil electrodes. Application of electrical potential applied to alternately biased electrodes causes each of the piezoelectric discs to expand or axially distort. Maintaining long life or reliability of the actuators has been a constant problem. However, utilizing a single-piece conductor having a plurality of electrodes for delivering power to the individual piezoelectric discs has improved actuator reliability significantly over prior designs. Yet, existing single-piece conductor designs have not proven favorable for manufacturing conditions.

In order to mass produce the piezoelectric actuators, manufacturing techniques or procedures have to be developed to assemble the actuators in an efficient manner while emphasizing high quality. One of the more difficult procedures in assembling the actuators is interleaving the metal foil electrodes between the piezoelectric discs. The design of the conductor is a critical feature for manufacturing the actuator, as well as, achieving high reliability of the actuator.

An example of a conventional electromechanical actuator having an active element of electroexpansive material is found in U.S. Pat. Nos. 3,501,099 and 3,635,016 to Glendon M. Benson. Benson's patents disclose an actuation amplification structure and a method for manufacturing piezoelectric actuators. FIG. 3A shows electrodes 300 interconnected to one another using straps 305, forming a first conductor 310. A second conductor 315 composed of the electrodes 300 is similarly interconnected. Shown in FIG. 3B, is an actuator 320 composed of a series of piezoelectric discs 325 with the electrodes 300 disposed between the discs 325 for supplying energy to the discs 325. The straps 305 of both groups are centered with respect to each electrode 300, and the first and second conductors 310,315 are disposed in the actuator 300 substantially orthogonal to each other as shown in FIG. 3C. The orthogonal relationship of the conductors 310,315 prevents the straps 305 of the first conductor 310 from contacting the straps 305 of the second conductor 315 creating a short circuit condition, causing actuator failure. Intrinsic with this type of electrode or conductor design is an assembly problem. While assembling the actuator 320, the two conductors 310,315 must be "woven" together while inserting the piezoelectric discs 325. Thus, the actuator is "built-up" disc by disc requiring a complicated assembly process.

Another example of a conventional electromechanical actuator is found in Japanese Publication No. 60-103685 by Masahiro Tomita. Tomita discloses an actuator composed of square piezoelectric elements intermeshed with two conductors. The conductors are formed of a metallic ribbon or rectangular strip interleaved between the piezoelectric squares. The conductors are bent and inserted between the piezoelectric elements during assembly. The rectangular configuration of the metal strips may effect reliability of the actuator. The angled edges may enhance corona and arcing under high voltage conditions, leading to premature actuator failure.

Additionally, various environmental design constraints are also important considerations in piezoelectric actuator manufacturing. Device operating temperature ranges and external mechanical stresses are the most serious of these factors. For example, heat generated by the actuator itself is compounded by the external environment in which the actuator is utilized. Moreover, shear and torsional stresses applied to the actuator can cause premature cracking of the piezoelectric discs. In order to minimize these problems an insulation layer is provided which surrounds the actuator. For example, the actuator may be encapsulated with a type of elastomer material having dielectric properties. Moreover, the conductor must be designed to incorporate the encapsulant to maintain actuator reliability.

For example, the larger the surface area of the conductor contacting the piezoelectric disc the greater the disc will expand. Alternately, the interconnection of the conductor between each disc should have a little as surface area as possible. For example, the rectangular strip disclosed in the Tomita reference is the same width throughout the conductor. After assembling the actuator, an encapsulant may be applied to the actuator. This would include filling the voids between the actuator and the conductor, i.e. filling between the folds of the conductor, to prevent electrical breakdown. Due to the large surface area throughout the conductor, this becomes a difficult task.

Once the assembly of the actuator is complete, including encapsulating the actuator and mounting of the actuator in a housing; the actuator is ready for operation. During operation, the temperature of the actuator will rise and the encapsulant will draw the thermal energy from the actuator. Responsive to the thermal energy, the encapsulant will expand uniformly—much greater than the expansion of the piezoelectric discs. Thus, a large pressure will be developed between the folds of the conductor where the encapsulant is disposed. The larger the surface area of the folded portions, the greater amount of pressure that will develop between folds of the conductor, and consequently the high pressure causes separation of the discs, yielding catastrophic actuator failure.

What is needed is an conductor design which can be assembled easily and quickly, and a design which improves actuator quality and reliability.

The present invention is directed to overcoming one or more of the problems as set forth above.

DISCLOSURE OF THE INVENTION

In one aspect of the present invention, a piezoelectric actuator is provided. The actuator includes a plurality of piezoelectric discs having first and second faces. The discs are axially aligned and arranged such that the first face of one disc is adjacent to the first face of a preceding disc in the actuator, and the second face of the one disc is adjacent to the second face of a succeeding disc. Also included is a first single-piece conductor having multiple electrodes, a first reference line passing through the center of each electrode and longitudinally through the first conductor, and a plurality of connecting portions adapted to interconnect each electrode.

The connecting portions are offset from the first reference line, and the first conductor is folded at the connecting portions and interposed between the piezoelectric discs such that successive electrodes interleave and contact the first faces of the discs. The actuator further includes a second single-piece conductor having multiple electrodes, a second reference line passing through the center of each electrode and longitudinally through the second conductor, and a plurality of connecting portions adapted to interconnect each electrode. The second conductor is folded at the connecting portions and interposed between the piezoelectric discs such that successive electrodes interleave and contact the second faces of the discs.

BRIEF DESCRIPTION OF THE DRAWINGS

For a better understanding of the present invention, reference may be made to the accompanying drawings in which:

FIG. 1A illustrates a top plan view of a first embodiment of the present invention;

FIG. 1B illustrates a side view of a piezoelectric actuator incorporating the first embodiment of the present invention;

FIG. 1C illustrates a top view of a piezoelectric actuator incorporating the first embodiment of the present invention;

FIG. 2A illustrates a top plan view of a second embodiment of the present invention;

FIG. 2B illustrates a side view of a piezoelectric actuator incorporating the second embodiment of the present invention;

FIG. 2C illustrates a top view of a piezoelectric actuator incorporating the second embodiment of the present invention;

FIG. 3B illustrates a side view of a piezoelectric actuator incorporating a conventional single-piece conductor design; and FIG. 3C illustrates a top view of a piezoelectric actuator incorporating a conventional single-piece conductor design.

BEST MODE FOR CARRYING OUT THE INVENTION

Figure 3A:
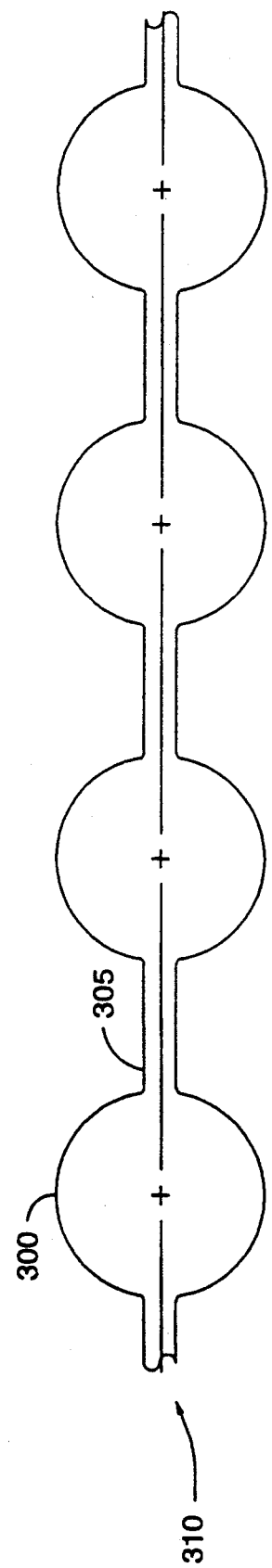
FIG. 3A illustrates a top plan view of a conventional single-piece conductor design.

The present invention is designed for an automated manufacturing process to yield high-quality, high-durability piezoelectric actuators in volume.

FIG. 1A illustrates a top plan view of a first embodiment of a design for a single-piece conductor. Shown are first and second single-piece conductors 101,102. The conductors 101,102 have a plurality of electrodes 105,105' interconnected by connecting portions 110,110'. The electrodes 105,105' are substantially circular with a diameter, D and have a front surface and a back surface.

The connecting portions 110,110' each have first and second ends 112,114,112',114'. For example, the first end 112,112' of a first connecting portion 110A,110'A is connected to a first electrode 105A,105'A and the second end 114,114' of the first connecting portion 110,110' is connected to a second electrode 105B,105'B. Additionally, each of the connecting portions 110,110' has a middle portion. The middle portion may have notches or grooves (not shown) on the periphery of the connecting portions 110,110' to aid in the folding of the connecting portions 110,110', which is discussed later. Utilizing notches or groves are well known and will not be further discussed. As shown, the connecting portions 110,110' are positioned between the electrodes 105,105' and within the length, D.

The first conductor 101 includes a first reference line 120 passing through the center of each electrode 105 and longitudinally through the first conductor 101. Similarly, the second conductor 102 includes a second reference line 122 passing through the center of each electrode 105, and longitudinally through the second conductor 102. Advantageously, the connecting portions 110,110' of the first and second conductors 101,102 are offset from the respective reference lines 120,122.

Advantageously, the conductors 101,102 are stamped from a single piece of metal, such as brass or any other electrically conductive alloy that would become evident to those skilled in the art. Typically, the thickness of the brass is between the range of 0.025 to 0.10 mm thick. The conductors 101,102 may also be shaped by using photo-etching or laser-cutting techniques. Each of these techniques are not critical to carrying out the present invention, and hence other techniques may become apparent to those skilled in the art.

In the embodiment shown, the length, $L_1$, between the first and second ends 112,112',114,114' of the connecting portions 110,110' are approximately 33.3% of D or $L_1 = \frac{1}{3} * D$. Additionally, the width W of the connecting portions 110,110' are approximately 50% of $L_1$ or $W = \frac{1}{2} * L_1$. The proportions given are for exemplary purposes only and other dimensional relations may be alternatively used.

FIG. 1B shows a side view of a partially assembled piezoelectric actuator 124. FIG. 1B illustrates a folded example of the first and second single-piece conductors 101,102 as described in FIG. 1A. Additionally, FIG. 1B is used for illustrative purposes only and is not drawn to scale. The piezoelectric actuator 124 includes a plurality of piezoelectric discs 126 having first and second faces 128A,128B. The discs 126 are axially aligned and arranged such that the first face 128A of one disc 126D is adjacent to the first face 128A of a preceding disc 126C in the actuator 124 and the second face 128B of the one disc 126D is adjacent to the second face 128B of a succeeding disc 126E.

The first conductor 101 is folded at the connecting portions 110 and interposed between the piezoelectric discs 126 such that successive electrodes 105 interleave and contact the first faces 128A of each of the discs 126 throughout the actuator 124. Similarly, the second single-piece conductor 102 is folded at the connecting portions 110 and interposed between the piezoelectric discs 126 such that successive electrodes 105 interleave and contact the second faces 128B of each of the discs 126 throughout the actuator 124. Advantageously, the diameter, D, of the electrodes 105,105' is preferably smaller than that of the discs 126. For example, the diameter of the electrodes 105,105' may be between a tolerance range of 0.5 to 1% smaller than the diameter of the piezoelectric discs 126. Therefore, arcing between the electrodes 105,105' with opposite polarities will be avoided.

The connecting portions 110,110' are folded such that the first and second conductors 101,102 sinuously interleave the piezoelectric discs 126. Additionally, one electrode 105,105' is interposed between each piezoelectric disc 126. The actuator 124 includes a longitudinal axis 138 passing through the center of the actuator 124. Advantageously, the first and second conductors 101,102 are disposed in the actuator 124 such that the center of the electrodes 105,105′ coincides with the longitudinal axis 138. A top view of the actuator 124 is illustrated in FIG. 1C. FIG. 1C shows that the first and second conductors 101,102 are disposed in the actuator 124 such that the first and second lines of reference 120,121, associated with each electrode 105,105′, coincide with each other.

Distinct advantages are afforded in the design of the conductors 101,102. For example, the assembly process is greatly enhanced. The "offset" connecting portions 110,110′ allow the conductors 101,102 to be pre-folded and then interlaced together, thus eliminating the more complicated weaving process required for the single-piece conductor design with centered straps as illustrated in FIG. 3. Hence, the complexity of the assembly process associated with the actuator 124 is reduced.

Further, to aid the assembly process the discs 126 are advantageously attached to the electrodes 105,105′. For example, the discs 126 can be laminated to each of the electrodes 105,105′ using a bonding agent. A polymer cement is one example of a bonding agent that may be utilized; however, those skilled in the art may recognize that other types of bonding agents may be equally employed. Moreover, the electrodes 105,105′ may have a series of perforations (not shown) which aid in the radial expansion/contraction of the electrodes 105,105′. For example, when the electrodes/discs are alternately biased, the piezoelectric properties cause the discs 126 to expand axially and contract radially. Therefore, since the discs 126 are attached to the electrodes 105,105′ the perforations aid in the expansion/contraction of the discs 126, preventing disc 126 cracking due to high stresses.

Additionally, if any mistakes are made during the assembly process, the present invention allows for easier removal of the conductors 101,102 as opposed to the "centered" conductor design which must be "unwoven" for removal. Moreover, since the electrodes 105,105′ are not soldered or fused together the strength of the conductors 101,102 is increased and actuator reliability is improved over conventional soldered or fused conductor designs, since the joined areas of the conventional conductor designs weaken with age and eventually fail.

A second embodiment of the present invention is shown in FIG. 2A, where a top plan view of a design for a single-piece conductor is illustrated. The first and second conductors 101,102 shown are similar to the first embodiment, and for simplicity, like elements are labeled the same. However, the lengths associated with the connecting portions 110,110′ of the first and the second conductors 101,102 alternate between a first and a second length. As described in the first embodiment, the first length, $L_1$, of the connecting portions 110,110′ is approximately 33.3% of D or $L_1 = \frac{1}{3} * D$. The second length, $L_2$, between the first end and the second end 112,112′,114,114′ of the connecting portions 110,110′ is approximately 66.6% of D or $L_1 = \frac{2}{3} * D$.

For example and as described previously, the first connecting portion 110A,110′A has a first length and connects the first electrode 105A,105′A to the second electrode 105B,105′B. Additionally, the first electrode 105A,105′A and the second electrode 105B,105′B form a first electrode pair 205A,205A′. Similarly, a second connecting portion 110C,110′C with a first length connects a third electrode 105C,105′C to a fourth electrode 105D,105′D. The third electrode 105C,105′C and the fourth electrode 105D,105′D form a second electrode pair 205B,205′B. Alternatively, a third connecting portion 110B,110′B with a second length connects the first and second electrode pairs 205A,205′A,205B,205′B. Hence, the first length, $L_1$, of the connecting portions 110,110′ connects each pair of electrodes 105,105′. Whereas, the second length, $L_2$, of the connecting portions 110,110′ connects the electrode pairs 205,205′.

FIG. 2B shows a side view of a partially assembled piezoelectric actuator 124. FIG. 2B illustrates a folded example of the first and second single-piece conductors 101,102 as described in FIG. 2A. Additionally, FIG. 2B is used for illustrative purposes only and is not drawn to scale. The piezoelectric actuator 124 includes a plurality of piezoelectric discs 126 having first and second faces 128A,128B. The discs 126 are axially aligned and arranged such that the first face 128A of one disc 126D is adjacent to the first face 128A of a preceding disc 126C in the actuator 124 and the second face 128B of the one disc 126D is adjacent to the second face 128B of a succeeding disc 126E.

The first conductor 101 is folded at the connecting portions 110 and interposed between the piezoelectric discs 126 such that successive electrodes 105 interleave and contact the first faces 128A of each of the discs 126 throughout the actuator 124. Similarly, the second single-piece conductor 102 is folded at the connecting portions 110 and interposed between the piezoelectric discs 126 such that successive electrodes 105 interleave and contact the second faces 128B of each of the discs 126 throughout the actuator 124.

More particularly, the connecting portions 110,110′, which have the first length, are folded about the middle portion such that the first and second ends 112,114,112′,114′ contact each other, forming a "loop". Thus, the electrodes 105,105′ composing the electrode pairs 205,205′ are folded toward one another so that the back surfaces of the electrodes 105,105′ contact each other. Additionally, the connecting portions 110,110′, which have the second length, are folded about the middle portion such that the electrode pairs 205,205′ become aligned and parallel with respect to each other. Moreover, the first and second conductors 101,102 are disposed in the actuator 124 such that one electrode pair 205,205′ is interposed between each piezoelectric disc 126, and the front surfaces of the electrodes 105,105′ composing the electrode pairs 205,205′ contact the respective faces 128A,128B of the piezoelectric discs 126.

Preferably, the folds of the connecting portions 110,110′ should take the form of a smooth bend. The radius of curvature of the fold/bend may take a wide range of values. However, creased folds are not desired. For example, if the fold has an increasingly smaller radius of curvature (i.e., a creased fold) arcing may occur. The dielectric encapsulant used to coat the actuator 124 may electrically breakdown caused by the arcing of a creased fold or sharp edge. Therefore, sharp edges may induce arcing during the operation of the actuator 124 leading to malfunctions. Finally, a crease is undesirable because the conductors 101,102 may eventually break due to stresses introduced at the fold/bend during operation of the actuator 124.

The actuator 124 also includes a longitudinal axis 138 passing through the center of the actuator 124. Advantageously, the first and second conductors 101,102 are disposed in the actuator 124 such that the center of the electrodes 105,105′ coincides with the longitudinal axis 138. A top view of the actuator 124 is illustrated in FIG.

2C. FIG. 2C shows that the first and second conductors 101,102 are disposed in the actuator 124 such that the first and second lines of reference 120,121' associated with each electrode 105,105', coincide with each other.

Industrial Applicability

An example of the operation of the present invention will now be discussed. The main function of a piezoelectric actuator 124 is to provide actuation. This is accomplished by applying high electrical potential to each of the piezoelectric discs 126. The power is delivered from a power supply (not shown) via the first and second conductors 101,102 to the individual discs 126 comprising the actuator 124. The first conductor 101 is connectable to a positive potential and the second conductor 102 is connectable to ground. Additionally, the first conductor 101 delivers positive energy to all the first faces 128A of the discs 126 throughout the actuator 124, and the second conductor 102 completes the electrical connection by contacting all the second faces 128B of the discs 126 throughout the actuator 124.

In response to receiving the energy from the first conductor 101 each of the discs 126 "grow" or expand in the axial direction, while the discs 126 "shrink" or contract in the radial direction. As each individual disc 126 in the actuator 124 expands, the actuator 124, likewise expands. Moreover, once electrical energy is removed from the discs 126, the discs 126 return to their original form. This expansive feature of piezoelectric material makes the ceramic desirable for many applications requiring actuation.

In short, the design of the conductors 101,102 allow the actuator 124 to be produced in a speedy manner and a manner in which actuator reliability is increased.

Other aspects, objects and advantages of the present invention can be obtained from a study of the drawings, the disclosure and the appended claims.

We claim:

1. A piezoelectric actuator, comprising:
   a plurality of piezoelectric discs having first and second faces, said discs being axially aligned and arranged such that the first face of one disc is adjacent to the first face of a preceding disc in the actuator and the second face of said one disc is adjacent to the second face of a succeeding disc;
   a first single-piece conductor having multiple electrodes, a first reference line passing through the center of each electrode and longitudinally through said first conductor, and a plurality of connecting portions adapted to interconnect each electrode, said connecting portions being offset from the first reference line, and said first conductor being folded at the connecting portions and interposed between said piezoelectric discs such that successive electrodes interleave and contact the first faces of said discs;
   a second single-piece conductor having multiple electrodes, a second reference line passing through the center of each electrode and longitudinally through said second conductor, and a plurality of connecting portions adapted to interconnect each electrode, said second conductor being folded at the connecting portions and interposed between said piezoelectric discs such that successive electrodes interleave and contact the second faces of said discs.

2. A piezoelectric actuator, as set forth in claim 1, wherein said connecting portions of said second conductor are offset from the second reference line.

3. A piezoelectric actuator, as set forth in claim 2, wherein said connecting portions each have first and second ends, the first end of a first connecting portion being connected to a first electrode and the second end of the first connecting portion being connected to a second electrode.

4. A piezoelectric actuator, as set forth in claim 3, wherein said electrodes have a substantially circular geometry.

5. A piezoelectric actuator, as set forth in claim 4, wherein each of said electrodes have a diameter of length, D, said connecting portions being positioned between said electrodes and less than the length, D.

6. A piezoelectric actuator, as set forth in claim 5, wherein said actuator includes a longitudinal axis passing through the center of said actuator, said first and second conductors being disposed in said actuator such that the center of said electrodes coincides with the longitudinal axis.

7. A piezoelectric actuator, as set forth in claim 6, wherein one electrode is interposed between each piezoelectric disc.

8. A piezoelectric actuator, as set forth in claim 7, wherein said connecting portions are folded such that said first and second conductors sinuously interleave said piezoelectric discs.

9. A piezoelectric actuator, as set forth in claim 6, wherein said first connecting portion has a first length, said first electrode and said second electrode form a first electrode pair.

10. A piezoelectric actuator, as set forth in claim 9, wherein a second connecting portion having the first length connects a third electrode to a fourth electrode, said third electrode and said fourth electrode form a second electrode pair.

11. A piezoelectric actuator, as set forth in claim 10, wherein a third connecting portion having a second length connects said first electrode pair to said second electrode pair, the second length being a different length than the first length.

12. A piezoelectric actuator, as set forth in claim 11, wherein said connecting portions have a middle portion, said first connecting portion being folded about the middle portion such that the first and second ends contact each other.

13. A piezoelectric actuator, as set forth in claim 12, wherein said electrodes have a front surface and a back surface, said first connecting portion being folded about the middle portion such that the back surfaces of said electrodes lie contiguous to each other.

14. A piezoelectric actuator, as set forth in claim 13, wherein said third connecting portion is folded about the middle portion such that the electrode pairs are aligned and parallel with respect to each other.

15. A piezoelectric actuator, as set forth in claim 14, wherein said first and second conductors are disposed in said actuator such that one electrode pair is interposed between each piezoelectric disc, and the front surfaces of said electrodes contact the respective faces of the piezoelectric discs.

* * * * *